(12) United States Patent
Ho

(10) Patent No.: US 12,130,675 B2
(45) Date of Patent: Oct. 29, 2024

(54) ELECTRONIC DEVICE AND CHASSIS HAVING THE SAME

(71) Applicant: Wistron Corporation, New Taipei (TW)

(72) Inventor: Zong-Han Ho, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 325 days.

(21) Appl. No.: 17/861,523

(22) Filed: Jul. 11, 2022

(65) Prior Publication Data

US 2023/0309253 A1 Sep. 28, 2023

(30) Foreign Application Priority Data

Mar. 25, 2022 (TW) .................................. 111111492

(51) Int. Cl.
*G06F 1/18* (2006.01)
*H05K 7/14* (2006.01)

(52) U.S. Cl.
CPC .............. *G06F 1/188* (2013.01); *G06F 1/187* (2013.01); *H05K 7/14325* (2022.08)

(58) Field of Classification Search
CPC ...... H05K 7/14325; G06F 1/188; G06F 1/187
See application file for complete search history.

(56) References Cited

U.S. PATENT DOCUMENTS

| | | | | |
|---|---|---|---|---|
| 4,941,841 A * | 7/1990 | Darden | ................ | H05K 5/0286 439/304 |
| 5,889,649 A * | 3/1999 | Nabetani | .............. | H05K 5/0265 361/740 |
| 6,377,447 B1 * | 4/2002 | Boe | ......................... | G06F 1/187 361/829 |
| 6,654,240 B1 * | 11/2003 | Tseng | ...................... | G06F 1/184 361/679.33 |
| 6,813,148 B2 * | 11/2004 | Hsu | ...................... | G11B 33/124 248/225.11 |
| 7,035,099 B2 * | 4/2006 | Wu | ......................... | G06F 1/187 248/225.11 |
| 7,495,903 B2 * | 2/2009 | Chen | ...................... | G06F 1/187 361/732 |

(Continued)

FOREIGN PATENT DOCUMENTS

TW M503728 U 6/2015
TW 201624852 A 7/2016

OTHER PUBLICATIONS

Examination report dated Nov. 14, 2022, listed in related Taiwan patent application No. 111111492.

*Primary Examiner* — Nidhi Thaker
(74) *Attorney, Agent, or Firm* — McClure, Qualey & Rodack, LLP

(57) ABSTRACT

A chassis includes an electronic device. The electronic device includes a box body, a fixed member, and a slidable member. The box body includes a first side plate. The first side plate includes a corresponding portion. The fixed member is fixed to the first side plate and includes a positioning structure. The slidable member is slidably arranged on the fixed member and includes a matching structure and a mismatch-proof structure. The mismatch-proof structure is arranged in the corresponding portion. The matching structure selectively matches the positioning structure to cause the mismatch-proof structure to be slidably arranged in the corresponding portion.

20 Claims, 17 Drawing Sheets

(56) References Cited

U.S. PATENT DOCUMENTS

| | | | |
|---|---|---|---|
| 7,523,901 B2* | 4/2009 | Wu | G11B 33/128 |
| | | | 248/27.3 |
| 7,535,697 B2* | 5/2009 | Robertson | G06F 1/187 |
| | | | 361/679.38 |
| 7,760,495 B2* | 7/2010 | Li | G06F 1/187 |
| | | | 361/679.37 |
| 8,072,745 B2* | 12/2011 | Chen | G11B 33/123 |
| | | | 361/679.33 |
| 2003/0058612 A1* | 3/2003 | Liu | G06F 1/183 |
| | | | 361/679.33 |
| 2005/0094369 A1* | 5/2005 | Chen | G06F 1/187 |
| 2005/0121581 A1* | 6/2005 | Chen | G06F 1/184 |
| 2007/0235625 A1* | 10/2007 | Liang | G06F 1/187 |
| 2007/0268662 A1* | 11/2007 | Zhang | G06F 1/187 |
| | | | 361/679.31 |

\* cited by examiner

ELECTRONIC DEVICE AND CHASSIS HAVING THE SAME

CROSS-REFERENCE TO RELATED APPLICATION

This non-provisional application claims priority under 35 U.S.C. § 119(a) to Patent Application No. 111111492 filed in Taiwan, R.O.C. on Mar. 25, 2022, the entire contents of which are hereby incorporated by reference.

BACKGROUND

Technical Field

The present invention relates to an electronic device, and in particular, to an electronic device capable of adjusting a position of a mismatch-proof structure.

Related Art

The electronic device is generally configured with a power supply. A power supply box is configured to accommodate the power supply and applicable to various electronic products. In this way, an electronic product is convenient to be electrically connected to the power supply to receive electric energy.

With the development of science and technology, specifications (for example, wattage, a direct current, and an alternating current) of the power supply are increasingly diversified. In order to enable the electronic product to be electrically connected to the power supply having suitable specifications, the power supply box has a mismatch-proof design thereon to prevent the electronic product from being electrically connected to the power supply having inappropriate specifications.

In recent years, the electronic product has more options in use of specifications of the power supply. For example, the electronic product may use a DC power supply or an AC power supply. Therefore, the electronic product is more flexible in design. However, in order to support the diversity of the electronic product in design, a plurality of power supply boxes are often required to be manufactured to correspond to different electronic products. For example, a difference between an electronic product and another electronic product is only that one uses the DC power supply and the other uses the AC power supply. In this case, two power supply boxes are required to be manufactured to correspond to different power supplies.

SUMMARY

In view of the above, in some embodiments, an electronic device includes a box body, a fixed member, and a slidable member. The box body includes a first side plate. The first side plate includes a corresponding portion. The fixed member is fixed to the first side plate and includes a positioning structure. The slidable member is slidably arranged on the fixed member and includes a matching structure and a mismatch-proof structure. The mismatch-proof structure is located on the corresponding portion. The matching structure selectively matches the positioning structure to cause the mismatch-proof structure to be slidably arranged in the corresponding portion.

In some embodiments, a chassis includes a housing and an electronic device. The electronic device is fixed to the housing and includes a box body, a fixed member, and a slidable member. The box body includes a first side plate. The first side plate includes a corresponding portion. The fixed member is fixed to the first side plate and includes a positioning structure. The slidable member is arranged on the fixed member and includes a matching structure and a mismatch-proof structure. The mismatch-proof structure is located on the corresponding portion. The matching structure selectively matches the positioning structure to cause the mismatch-proof structure to be slidably arranged in the corresponding portion.

Therefore, according to some embodiments, in the electronic device, the slidable member is located on the fixed member, the mismatch-proof structure of the slidable member is located on the corresponding portion, and the matching structure of the slidable member selectively matches the positioning structure of the fixed member. In this way, the mismatch-proof structure may move on the corresponding portion with movement of the slidable member on the fixed member. The matching structure matches the positioning structure, to cause the mismatch-proof structure to be at different positions of the box body. In some embodiments, the electronic device is the power supply box, the electronic device may adjust the position of the mismatch-proof structure for the power supply having an applicable specification, thereby causing the electronic device to support the diversity of the electronic product in design.

DETAILED DESCRIPTION

Figure 1:
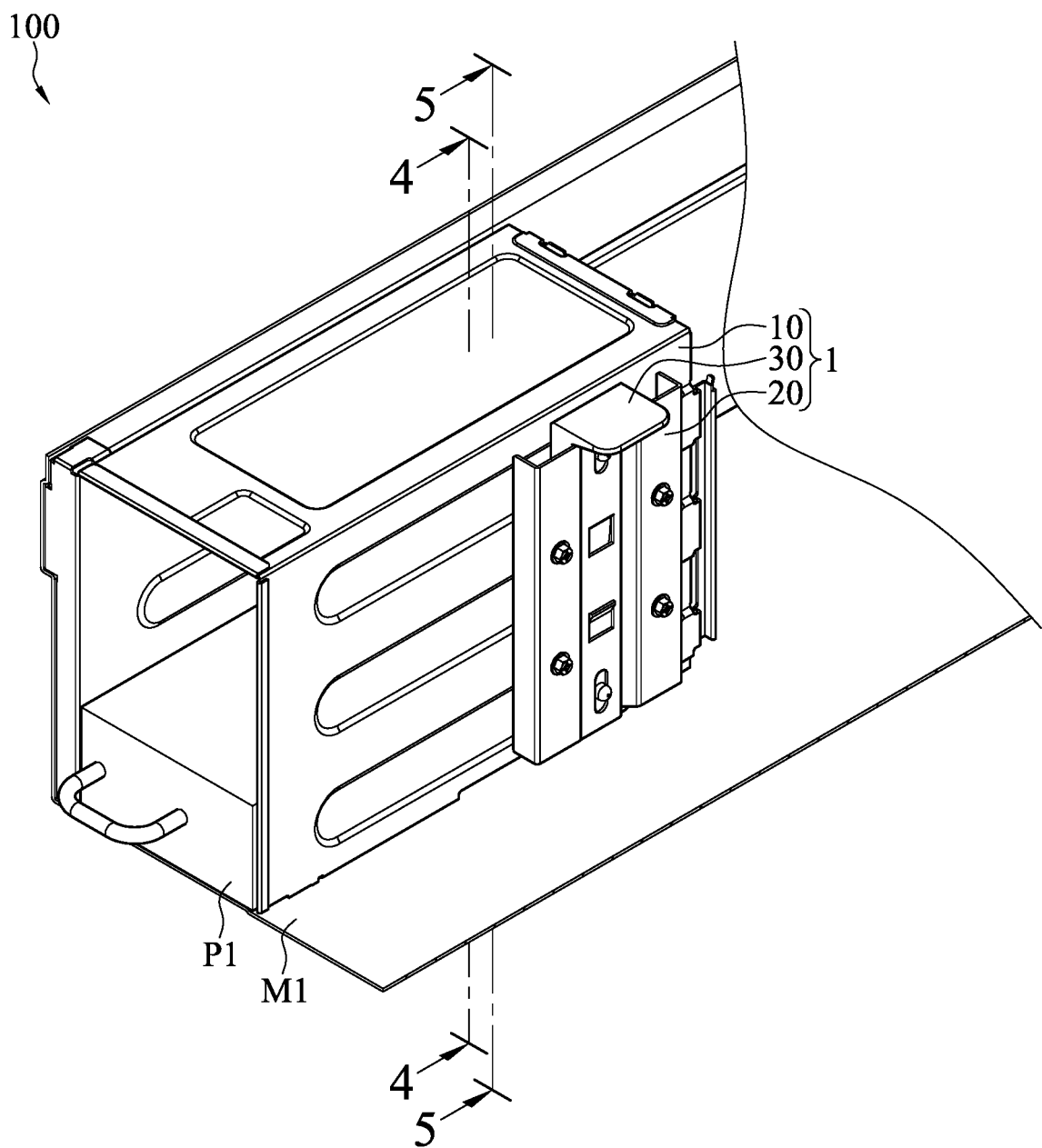
FIG. 1 illustrates a schematic three-dimensional view in which a power supply in a chassis is placed in an electronic device according to some embodiments.
Figure 2:
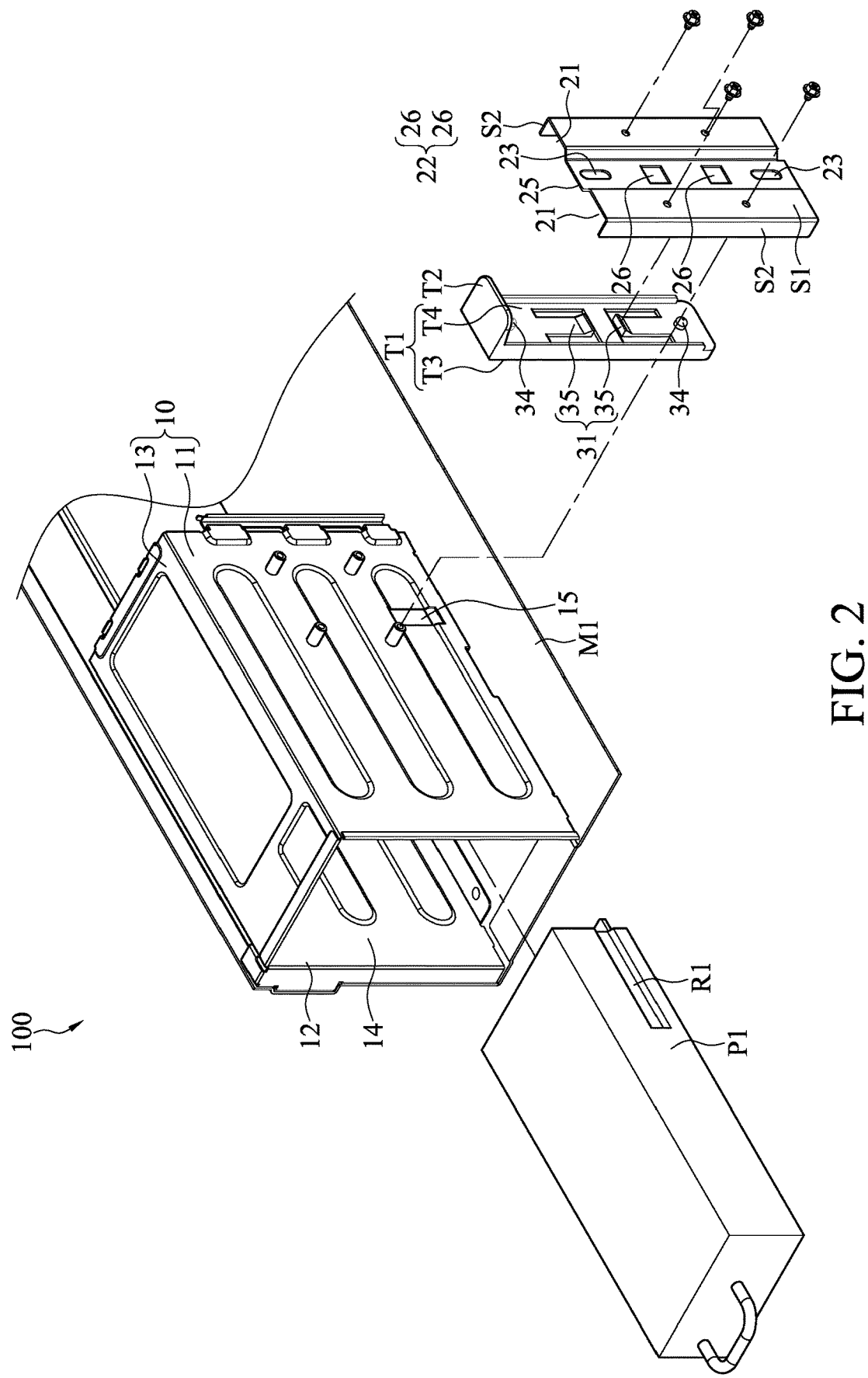
FIG. 2 illustrates a schematic exploded view of an electronic device in a chassis according to some embodiments.

FIG. 1 is a schematic three-dimensional view in which a power supply in a chassis is placed in an electronic device according to some embodiments. FIG. 2 is a schematic exploded view of an electronic device in a chassis according to some embodiments. As shown in FIG. 1 and FIG. 2, a chassis 100 can be applied to various electronic products, for example, a server, a desktop computer, or a notebook computer. The chassis 100 is configured to accommodate and protect internal parts of the electronic product. The chassis 100 includes a housing M1 and an electronic device 1. The housing M1 of the chassis 100 is fixed and surrounds the electronic device 1 to protect the electronic device 1 from external impact. In some embodiments, the electronic device 1 is a power supply box, which is not limited thereto.

As shown in FIG. 1 and FIG. 2, the electronic device 1 includes a box body 10, a fixed member 20, and a slidable member 30. The electronic device 1 can be configured to accommodate two different types of power supplies (described in detail later), that is, a power supply P1 and a power supply P2 (see FIG. 6). In this way, the electronic product is convenient to be electrically connected to the power supplies P1 and P2 to receive electric energy.

As shown in FIG. 1 and FIG. 2, in some embodiments, the box body 10 of the electronic device 1 includes a first side plate 11. One end of the first side plate 11 is connected to the housing M1 of the chassis 100. An accommodating portion 14 is formed on one side of the first side plate 11 (a left side of the first side plate 11 in FIG. 1). In an embodiment, the accommodating portion 14 is configured to accommodate a power supply. In some embodiments, the box body 10 of the electronic device 1 includes the first side plate 11, a second side plate 12, and a top plate 13. The top plate 13 is connected between the first side plate 11 and the second side plate 12, and the accommodating portion 14 (that is, an internal space of the box body 10) is formed among the top plate 13, the first side plate 11, and the second side plate 12. In some embodiments, the first side plate 11 and the second side plate 12 stretch from two ends of the top plate 13, and other ends of the first side plate 11 and the second side plate 12 are connected to the housing M1 of the chassis 100 relative to another end connected to the top plate 13. In this way, the accommodating portion 14 is formed among the housing M1, the first side plate 11, the second side plate 12, and the top plate 13. In some embodiments, the top plate 13 is connected between a plate surface of the first side plate 11 and a plate surface of the second side plate 12.

Carrying on with the above, as shown in FIG. 2, the first side plate 11 includes a corresponding portion 15, and the corresponding portion 15 extends through the first side plate 11 to communicate with the accommodating portion 14. That is to say, the corresponding portion 15 may communicate the internal space of the box body 10 with an external space outside the box body 10. In an embodiment, the corresponding portion 15 is an opening.

As shown in FIG. 1 and FIG. 2, the fixed member 20 of the electronic device 1 is fixed to the first side plate 11. In some embodiments, the fixed member 20 is locked to the first side plate 11. In some embodiments, the fixed member is fixed to the first side plate by riveting, adhering, or snapping. The manner in which the fixed member 20 is fixed to the first side plate 11 is not limited thereto, as long as the fixed member 20 can be fixed to the first side plate 11. In an embodiment, the fixed member 20 can be arranged on the second side plate 12 or simultaneously arranged on the first side plate 11 and the second side plate 12.

Figure 3:
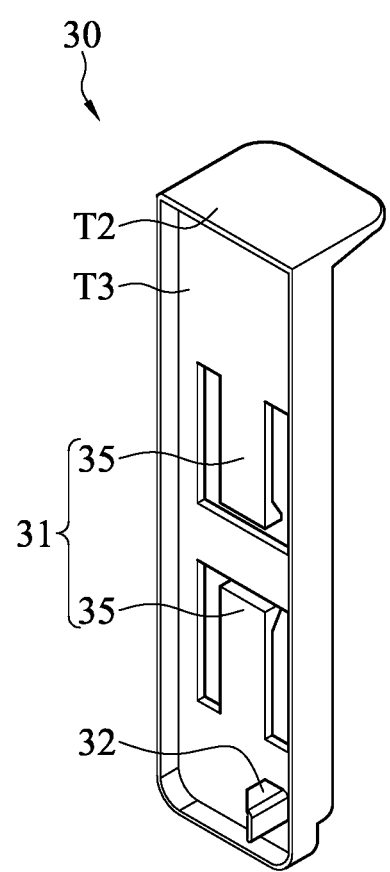
FIG. 3 illustrates a schematic three-dimensional view of a slidable member according to some embodiments.

FIG. 3 illustrates a schematic three-dimensional view of a slidable member according to some embodiments. Carrying on with the above, as shown in FIG. 1 and FIG. 2, the fixed member 20 includes a sliding groove 21 and a positioning structure 22. As shown in FIG. 1 to FIG. 3, the slidable member 30 is located in the sliding groove 21 of the fixed member 20, and the slidable member 30 is movable in the sliding groove 21. The slidable member 30 includes a matching structure 31 and a mismatch-proof structure 32 (see FIG. 3). The positioning structure 22 matches the matching structure 31, and the mismatch-proof structure 32 is located on the corresponding portion 15 and extends into the accommodating portion 14 of the box body 10.

Figure 4:
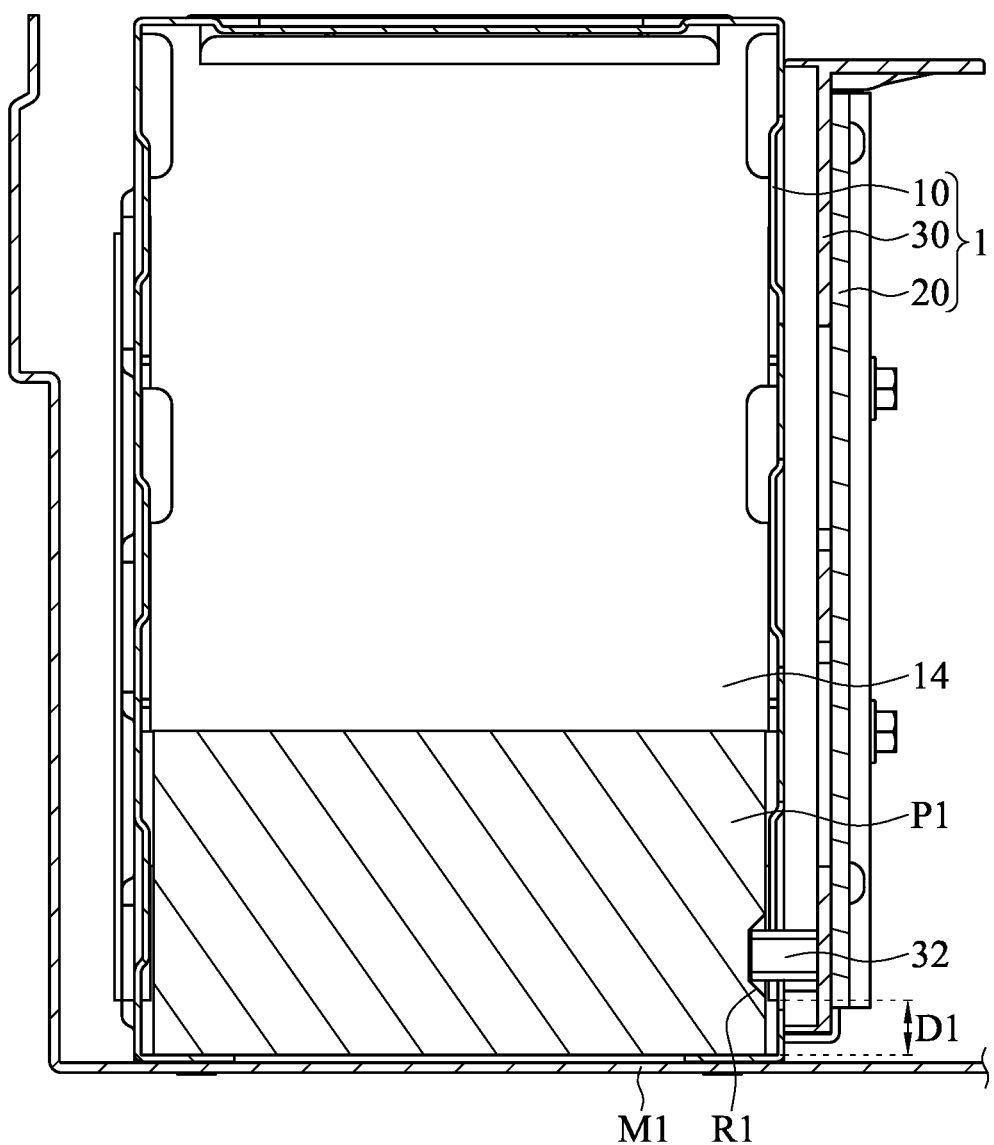
FIG. 4 illustrates a schematic partial cross-sectional view of a chassis at a position 4-4 in FIG. 1 when a slidable member is at a first position according to some embodiments.

FIG. 4 illustrates a schematic partial cross-sectional view of a chassis at a position 4-4 in FIG. 1 when a slidable member is at a first position according to some embodiments. Referring to FIG. 2 to FIG. 4 together, in some embodiments, the power supply P1 is a DC power supply and accommodated in the accommodating portion 14 of the box body 10. The power supply P1 includes a recess R1, and the recess R1 can be mated with the mismatch-proof structure 32. The mating between the recess R1 and the mismatch-proof structure 32 means that a shape of the recess R1 matches a shape of the mismatch-proof structure 32. In this way, during the power supply P1 being pushed into the accommodating portion 14 (the power supply P1 is pushed into the accommodating portion 14 toward the upper right in FIG. 2), the recess R1 is mated with the mismatch-proof structure 32. In this way, the power supply P1 can be smoothly pushed to a predetermined position (for example, a bottom of the accommodating portion). Next, when the slidable member 30 is at a first position (that is to say, the slidable member 30 is at the position shown in FIG. 4), a position of the recess R1 corresponds to a position of the mismatch-proof structure 32. Therefore, the power supply P1 can be placed in the electronic device 1, and will not be pushed against the mismatch-proof structure 32 and cannot be placed in the accommodating portion 14. The matching of the shape of the recess R1 and the shape of the mismatch-proof structure 32 does not require the two shapes being the same, as long as the power supply P1 can be placed in the electronic device 1 when the position of the recess R1 corresponds to the position of the mismatch-proof structure 32. In addition, when the position of the recess R1 does not correspond to the position of the mismatch-proof structure 32, the power supply P1 is pushed against the mismatch-proof structure 32 and cannot be placed in the electronic device 1.

Figure 6:
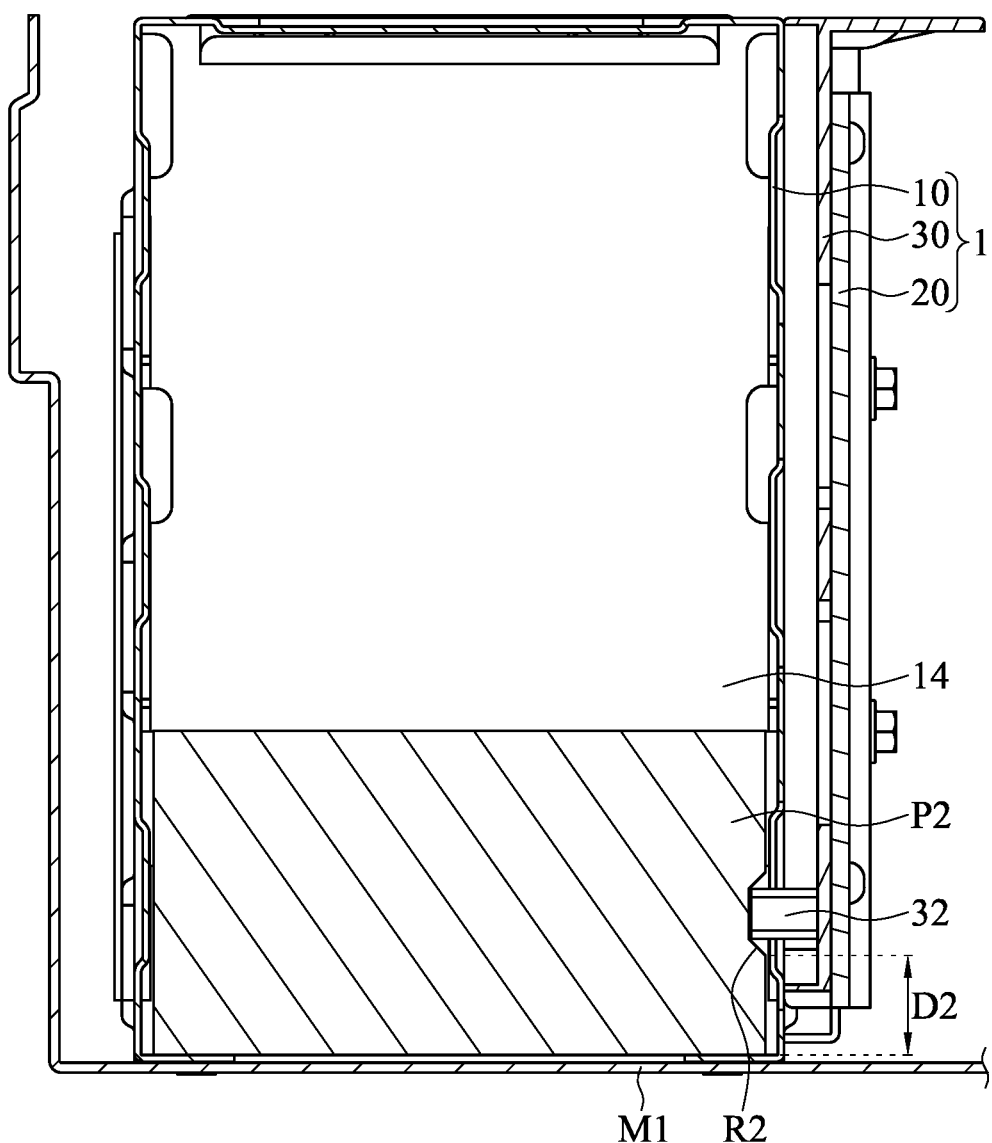
FIG. 6 illustrates a schematic partial cross-sectional view of a chassis when a slidable member is at a second position according to an embodiment corresponding to FIG. 4.

FIG. 6 illustrates a schematic partial cross-sectional view of a chassis when a slidable member is at a second position according to an embodiment corresponding to FIG. 4. Comparing FIG. 4 with FIG. 6, a difference between FIG. 6 and FIG. 4 is that the power supply P2 is an AC power supply, and the position of the recess R2 in the AC power supply is different from the position of the recess R1 in the DC power supply. Specifically, a distance D2 (see FIG. 6) from the recess R2 to a bottom of the AC power supply is greater than a distance D1 (see FIG. 4) from the recess R1 to a bottom of the DC power supply. Since the position of the mismatch-proof structure 32 corresponds to the recess R2 of the AC power supply when the slidable member 30 is at the second position, the AC power supply can be smoothly inserted into the accommodating portion 14. On the contrary, when the slidable member 30 is at the second position, the position of the mismatch-proof structure 32 does not correspond to the recess R1 of the DC power supply P1 (as shown in FIG. 4). Therefore, the DC power supply P1 cannot be inserted into the accommodating portion 14 due to abutment against the mismatch-proof structure.

Therefore, according to some embodiments, in the electronic device 1, the slidable member 30 is located on the fixed member 20, the mismatch-proof structure 32 of the slidable member 30 is located on the corresponding portion 15, and the matching structure 31 of the slidable member 30 matches the positioning structure 22 of the fixed member 20. In this way, the mismatch-proof structure 32 may move on the corresponding portion 15 with movement of the slidable member 30 on the fixed member 20. The matching structure 31 matches the positioning structure 22, to cause the mismatch-proof structure 32 to be at different positions of the accommodating portion 14. Therefore, the electronic device 1 may adjust the position of the mismatch-proof structure 32 for the power supply having an applicable specification, to support the diversity of the electronic product in design.

As shown in FIG. 1 and FIG. 2, in some embodiments, the fixed member 20 is integrally formed and includes a positioning plate S1 and two side positioning plates S2. The two side positioning plates S2 extend from two sides of the positioning plate S1 toward the first side plate 11. A sliding groove 21 is formed between the positioning plate S1 and the two side positioning plates S2, and the sliding groove 21 includes a bottom 25. The bottom 25 is located on a side of the positioning plate S1 facing the first side plate 11. That is to say, the bottom 25 protrudes from the positioning plate S1 toward a side of the first side plate 11 (the bottom 25 is closer to the first side plate 11 than the sliding groove 21). The positioning structure 22 of the fixed member 20 is arranged on the positioning plate S1 of the fixed member 20. In an embodiment, as shown in FIG. 2, the bottom 25 is located between the two side positioning plates S2 to form two sliding grooves 21 therebetween. That is to say, the fixed member 20 includes two sliding grooves 21 configured for the slidable member 30 to slide thereon.

As shown in FIG. 2 and FIG. 3, in some embodiments, the slidable member 30 includes a carrying plate T1 and a handle block T2. The carrying plate T1 may move in the sliding groove 21, and the handle block T2 is located outside the sliding groove 21. The carrying plate T1 includes an inner carrying surface T3 and an outer carrying surface T4. The inner carrying surface T3 faces the first side plate 11, and the outer carrying surface T4 faces the bottom 25. The matching structure 31 of the slidable member 30 is arranged on the carrying plate T1, and the mismatch-proof structure 32 of the slidable member 30 is arranged on the inner carrying surface T3.

As shown in FIG. 1 and FIG. 2, in some embodiments, the positioning structure 22 includes two positioning portions 26. The two positioning portions 26 are arranged side by side from the top plate 13 toward the housing M1. In some embodiments, the matching structure 31 includes one matching portion 35 (not shown). As shown in FIG. 2, the matching structure 31 includes two matching portions 35. The two matching portions 35 are arranged from the top plate 13 toward the housing M1 (that is, the two matching portions 35 are sequentially configured in a vertical direction in FIG. 2). One of the two matching portions 35 selectively matches one of the two positioning portions 26. The matching between the positioning portion 26 and the matching portion 35 herein means that the positioning portion 26 and the matching portion 35 can be fixed to each other (for example, by snap-fitting, by locking, or by means of mating between a shaft and a hole, which is not limited thereto). In some embodiments, the positioning structure 22 has one positioning portion 26, and the matching structure 31 has two matching portions 35, and one of the two matching portions 35 is selectively matched with the positioning portion 26 (not shown).

Figure 5:
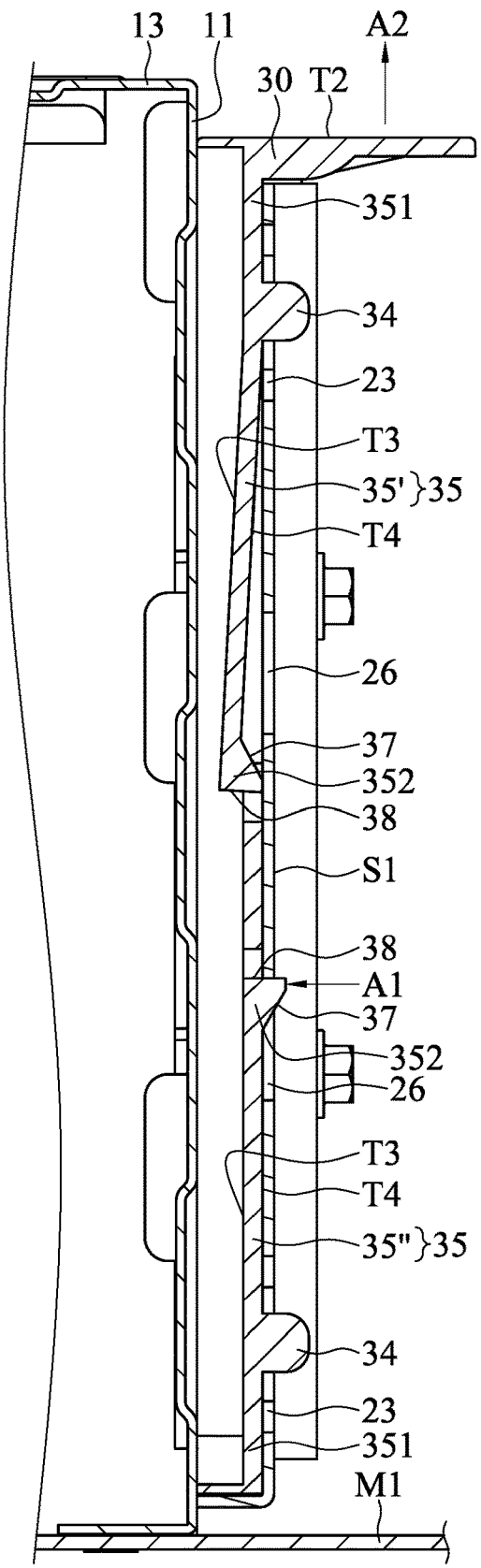
FIG. 5 illustrates a schematic partial cross-sectional view of a chassis at a position 5-5 in FIG. 1 when a slidable member is at a first position and a matching portion is an elastic arm according to some embodiments.

FIG. 5 illustrates a schematic partial cross-sectional view of a chassis at a position 5-5 in FIG. 1 when a slidable member is at a first position and a matching portion is an elastic arm according to some embodiments. Referring to FIG. 4 and FIG. 5, in some embodiments, when the matching portion 35 in the matching structure 31 close to the housing M1 matches the positioning portion 26 in the positioning structure 22 close to the housing M1 (that is, the matching portion 35 and the positioning portion 26 at a lower part of the figure), the slidable member 30 is at the first position. In addition, the position of the mismatch-proof structure 32 can be mated with the recess R1 of the power supply P1 (since a cross-sectional position in FIG. 5 is different from that in FIG. 4, the mismatch-proof structure cannot be seen in FIG. 5, and for the position of the mismatch-proof structure 32, reference is made to FIG. 4). Therefore, when the slidable member 30 is at the first position, the accommodating portion 14 may accommodate the power supply P1.

Figure 7:
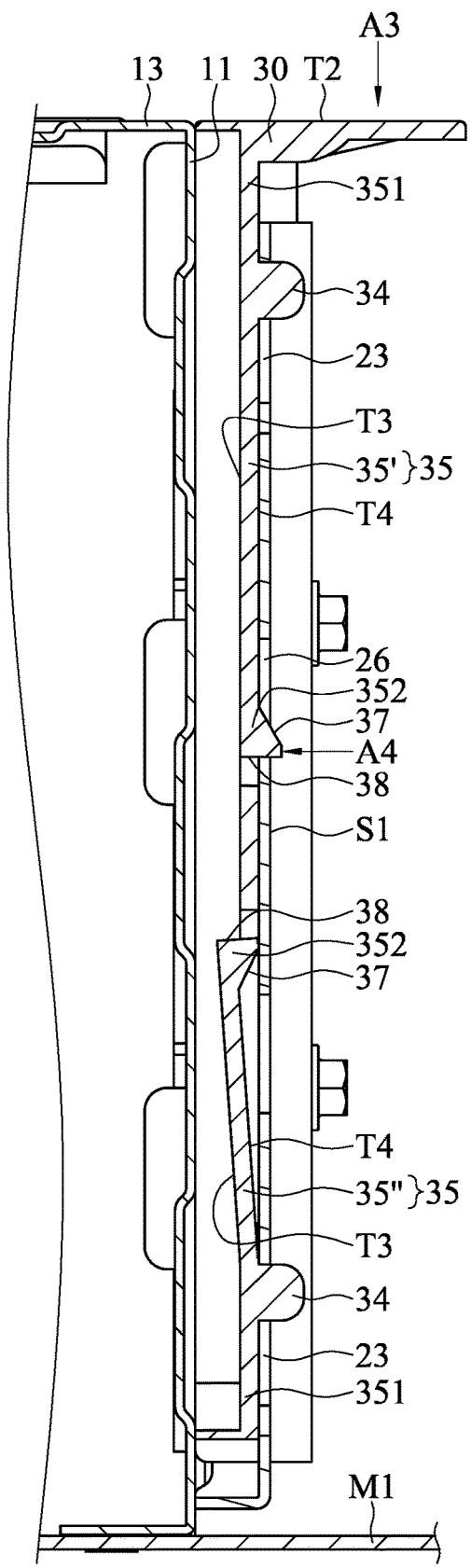
FIG. 7 illustrates another schematic partial cross-sectional view of a chassis when a slidable member is at a second position and a matching portion is an elastic arm according to an embodiment corresponding to FIG. 5.

FIG. 7 illustrates another schematic partial cross-sectional view of a chassis when a slidable member is at a second position and a matching portion is an elastic arm according to an embodiment corresponding to FIG. 5. Referring to FIG. 2, FIG. 6, and FIG. 7, in some embodiments, when the matching portion 35 in the matching structure 31 close to the top plate 13 matches the positioning portion 26 in the positioning structure 22 close to the top plate 13 (that is, the matching portion 35 and the positioning portion 26 at an upper part of the figure), the slidable member 30 is at the second position. In addition, the position of the mismatch-proof structure 32 can be mated with the recess R2 of the power supply P2 (refer to FIG. 6). Therefore, when the slidable member 30 is at the second position, the accommodating portion 14 may accommodate the power supply P2.

The positioning portion 26 can match the matching portion 35 in a plurality of manners, which is to be illustrated below. In some embodiments, the matching portion 35 comprises an inclined surface 37 and an abutment surface 38, and the inclined surface 37 is connected to the abutment surface 38. As shown in FIG. 2 and FIG. 5, the two positioning portions 26 are two square holes, and the two matching portions 35 are two elastic arms. Each elastic arm includes a fixed end 351 and a movable end 352 (see FIG. 5), and the movable ends of the two elastic arms face each other. An inclined surface 37 and an abutment surface 38 that are connected protrude from the movable end 352 of each elastic arm. The abutment surface 38 protrudes from the outer carrying surface T4 toward the positioning plate S1. The inclined surface 37 is farther away from the movable end 352 than the abutment surface 38, and the inclined surface 37 gradually decreases from the abutment surface 38 to the outer carrying surface T4 along a direction of the movable end 352 toward the fixed end 351.

Carrying on with the above, as shown in FIG. 5, when the slidable member 30 is at the first position, the abutment surface 38 of the elastic arm close to the housing M1 abuts against a hole edge of the square hole (that is, the embodiment in which the positioning portion 26 is a square hole), and the elastic arm close to the top plate 13 is pushed by the positioning plate S1 to deform toward the first side plate 11. Since the abutment surface 38 of the elastic arm abuts against the hole edge of the square hole, the matching portion 35 close to the housing M1 is snap-fitted to the positioning portion 26 close to the housing M1. The elastic arm at the top of FIG. 5 is named a first elastic arm 35', and the elastic arm at the bottom of FIG. 5 is named a second elastic arm 35". The first elastic arm 35' is located above the second elastic arm 35". The above is a side close to the top plate 13. When the slidable member 30 is at the first position (the position shown in FIG. 5), the inclined surface 37 of the first elastic arm 35' abuts against the fixed member 20 and does not protrude from the corresponding positioning portion 26, and the abutment surface 38 of the second elastic arm 35" abuts against the corresponding positioning portion 26 and protrudes from the corresponding positioning portion 26.

Carrying on with the above, referring to FIG. 5 and FIG. 7, a force is applied to the movable end of the elastic arm close to the housing S1 to face the first side plate 11 (the force application direction is shown by an arrow A1 in FIG. 5), and a force is applied to the handle block T2 of the slidable member 30 to move away from the housing M1 (the force application direction is shown by an arrow A2 in FIG. 5). In this way, the elastic arm close to the housing M1 is removed from the square hole close to the housing M1, and the elastic arm close to the top plate 13 tends to approach the square hole of the top plate 13. The inclined surface 37 is farther away from the movable end 352 than the abutment surface 38, and the inclined surface 37 gradually decreases from the abutment surface 38 to the outer carrying surface T4 along a direction of the movable end 352 toward the fixed end 351. Therefore, the force is continuously applied to the handle block T2 of the slidable member 30 to move away from the housing M1 (the force application direction is shown by the arrow in FIG. 5), and the inclined surface 37 guides the abutment surface 38 of the elastic arm close to the top plate 13 to tend to approach the hole edge of the square hole of the top plate 13.

Carrying on with the above, as shown in FIG. 7, when the abutment surface 38 of the elastic arm close to the top plate 13 abuts against the hole edge of the square hole close to the top plate 13, that is to say, when the matching portion 35 close to the top plate 13 is snap-fitted to the positioning portion 26 close to the top plate 13, the slidable member 30 is at the second position (that is, the position in FIG. 7).

Carrying on with the above, as shown in FIG. 7, conversely, if the slidable member 30 is required to be switched from the second position to the first position, a force is required to be applied to the handle block T2 of the slidable member 30 to face the housing M1 (the force application direction is shown by an arrow A3 in FIG. 7), and a force is applied to the movable end 352 of the elastic arm close to the top plate 13 to face the first side plate 11 (the force application direction is shown by an arrow A4 in FIG. 7). In this way, the elastic arm close to the top plate 13 is removed from the square hole, and the elastic arm close to the housing M1 tends to approach the square hole of the housing M1. The elastic arm at the top of FIG. 7 is named a first elastic arm 35', and the elastic arm at the bottom of FIG. 7 is named a second elastic arm 35". When the slidable member 30 is at the second position (the position shown in FIG. 7), the inclined surface 38 of the first elastic arm 35' abuts against the corresponding positioning portion 26 and protrudes from the corresponding positioning portion 26, and the abutment surface 37 of the second elastic arm 35" abuts against the fixed member 20 and does not protrude from the corresponding positioning portion 26.

As shown in FIG. 2, FIG. 5, and FIG. 7, in some embodiments, the fixed member 20 further includes a first guiding portion 23, and the first guiding portion 23 is arranged on the positioning plate S1 along the direction of the housing M1 toward or away from the top plate 13. The first guiding portion 23 is two guide slots, and the two guide slots are respectively located on two sides of the positioning structure 22. One guide slot is adjacent to the top plate 13, and an other guide slot is adjacent to the housing M1. The slidable member 30 further includes a second guiding portion 34, the second guiding portion 34 is two guide posts, and the first guiding portion 23 corresponds to the second guiding portion 34. In some embodiments, the first guiding portion 23 is a guide post, and the second guiding portion 34 is a guide slot.

Carrying on with the above, as shown in FIG. 2, FIG. 5, and FIG. 7, the first guiding portion 23 is arranged on the positioning plate S1 along the direction of the housing M1 toward or away from the top plate 13, and the first guiding portion 23 corresponds to the second guiding portion 34. Therefore, when the slidable member 30 moves in the sliding groove 21 of the fixed member 20, the slidable member 30 may move in a direction toward or away from the top plate 13 from the housing M1 as the second guiding portion 34 is guided by the first guiding portion 23.

Figure 8:
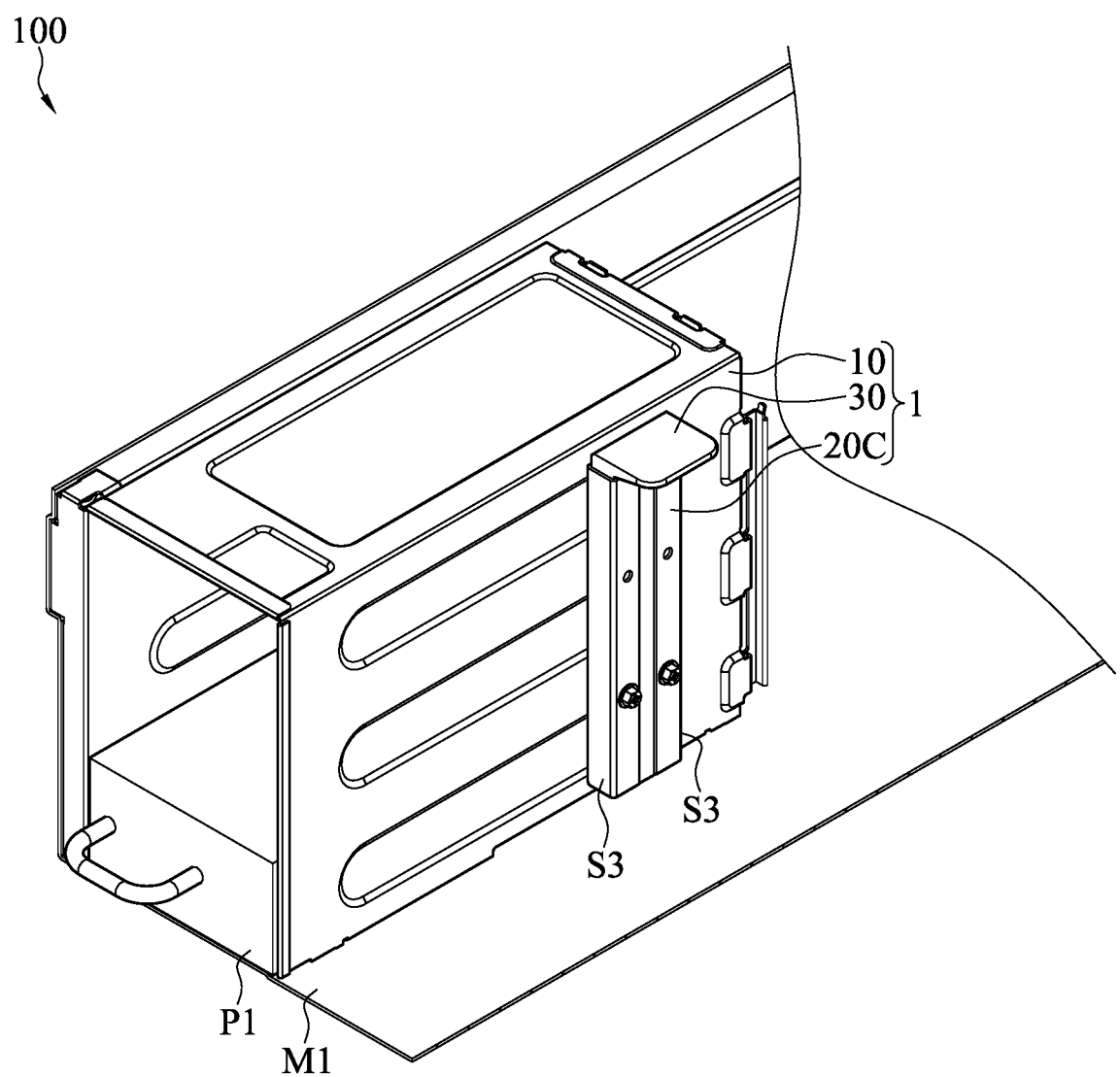
FIG. 8 illustrates a schematic three-dimensional view in which a fixed member includes two members and a power supply in a chassis is placed in the electronic device according to some embodiments.
Figure 9:
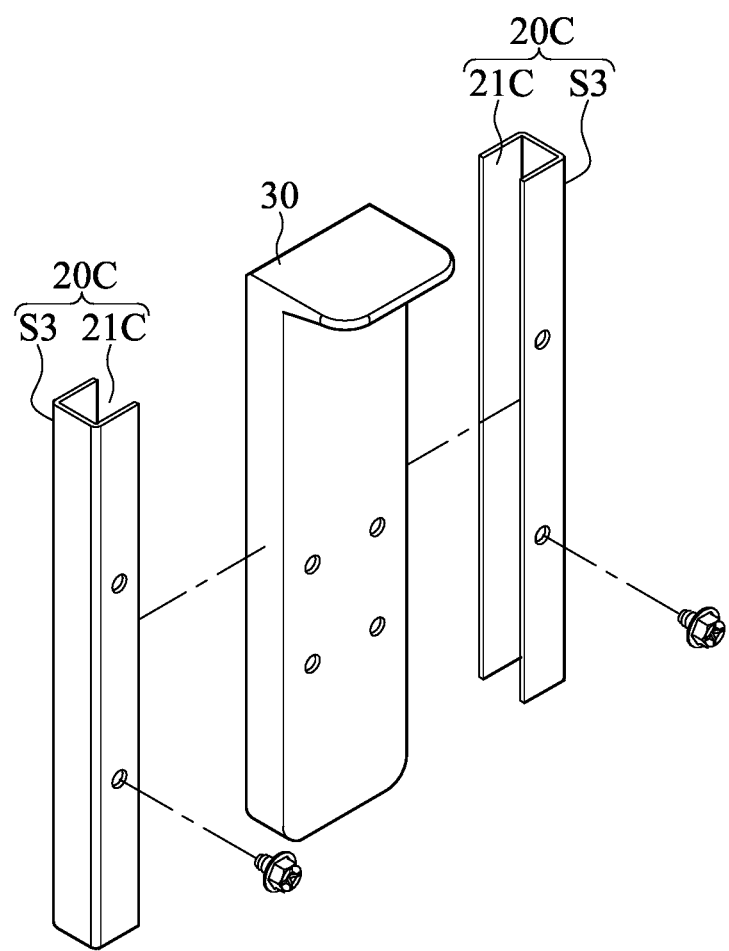
FIG. 9 illustrates a schematic exploded view in which a fixed member includes two members and a power supply in a chassis is placed in the electronic device according to some embodiments.

FIG. 8 illustrates a schematic three-dimensional view in which a fixed member includes two members and a power supply in a chassis is placed in the electronic device according to some embodiments. FIG. 9 illustrates a schematic exploded view in which a fixed member includes two members and a power supply in a chassis is placed in the electronic device according to some embodiments. As shown in FIG. 8 and FIG. 9, in some embodiments, the fixed member 20C includes two members: two fixed sub-members S3 and two sliding grooves 21C. Each fixed sub-member S3 is in a shape of a long column, and the two sliding grooves 21C are respectively recessed in the two fixed sub-members S3 and are opposite to each other. Two sides of the slidable member 30 are respectively slidably arranged in the two sliding grooves 21C of the fixed member 20C.

Figure 10:
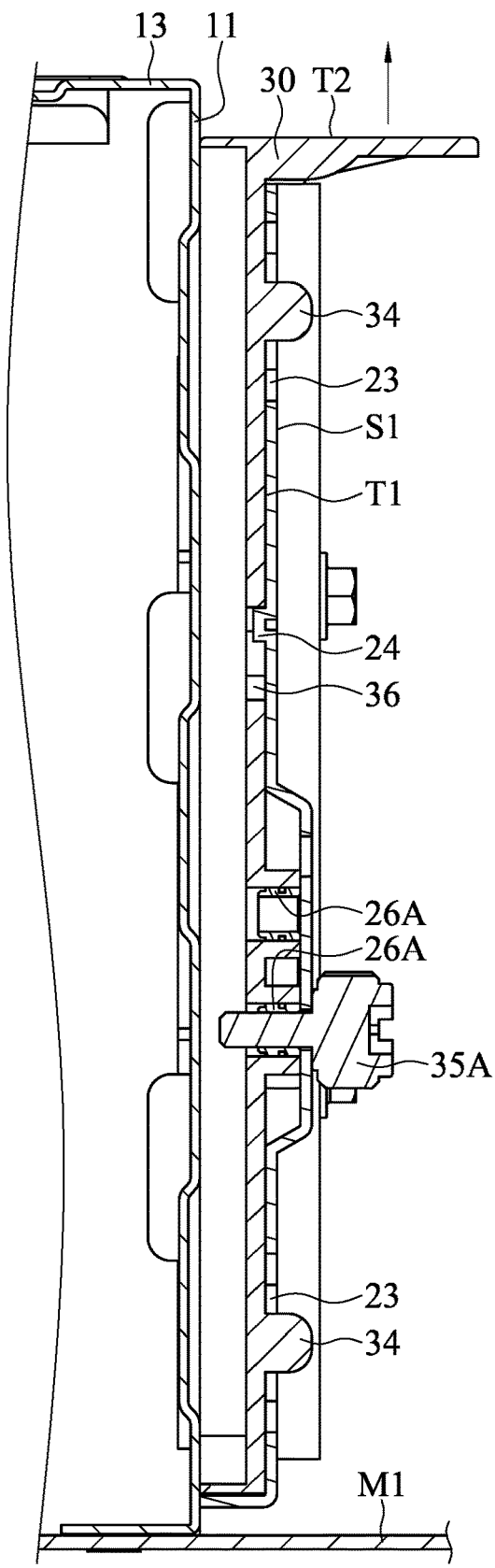
FIG. 10 illustrates another partial cross-sectional view of a chassis when a slidable member is at a first position and a matching portion is a bolt according to some embodiments.
Figure 11:
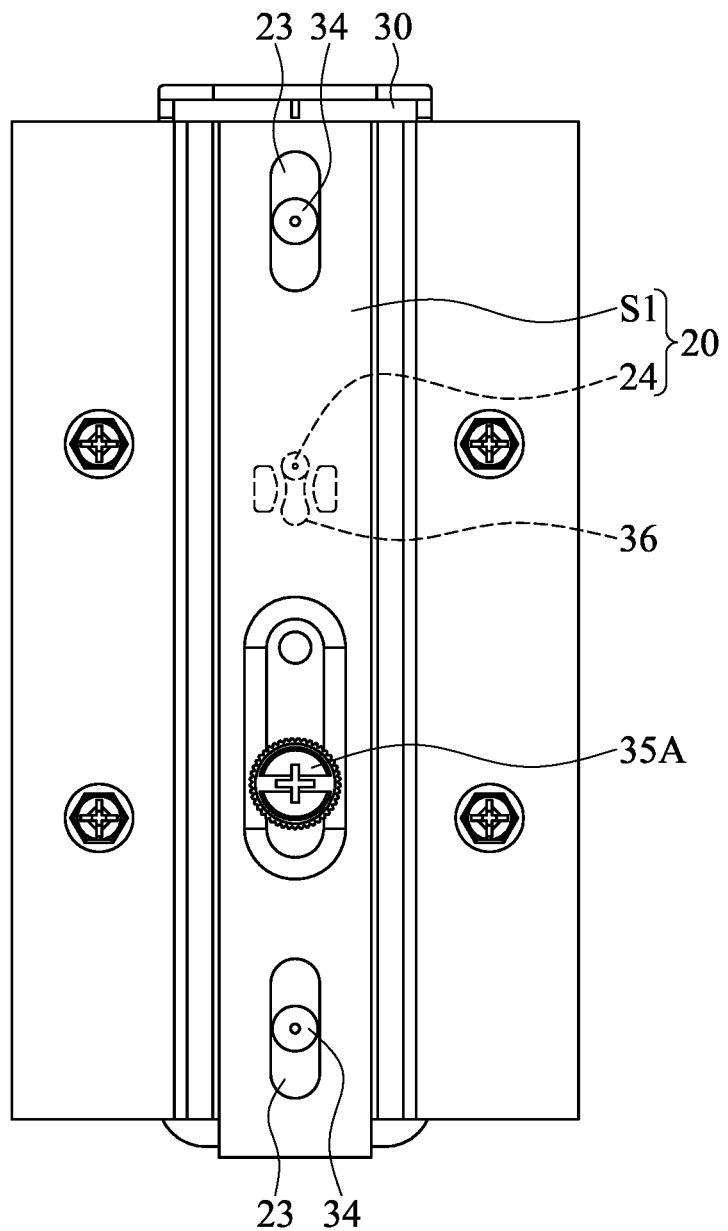
FIG. 11 illustrates a schematic side view of a fixed member and a slidable member when a slidable member is at a first position and the matching portion is a bolt according to some embodiments.

FIG. 10 illustrates another partial cross-sectional view of a chassis when a slidable member is at a first position and a matching portion is a bolt according to some embodiments. FIG. 11 illustrates a schematic side view of a fixed member and a slidable member when a slidable member is at a first position and the matching portion is a bolt according to some embodiments. Regarding the manner in which the positioning portion matches the matching portion, in another example, as shown in FIG. 10 and FIG. 11, each positioning portion 26A is a locking hole, and the matching portion 35A is the bolt.

Carrying on with the above, as shown in FIG. 10 and FIG. 11, when the slidable member 30 is at the first position, the bolt is locked to the locking hole close to the housing M1. That is to say, the matching portion 35A is locked to the positioning portion 26A close to the housing M1. If the slidable member 30 is required to be switched from the first position to the second position, the matching portion 35A is required to be unlocked from the positioning portion 26A close to the housing M1, and a force is applied to the handle block T2 of the slidable member 30 to move away from the housing M1 (the force application direction is a direction toward the top of the figure as shown by the arrow in FIG. 10). In this way, the slidable member 30 can be moved from the first position to the second position.

Figure 12:
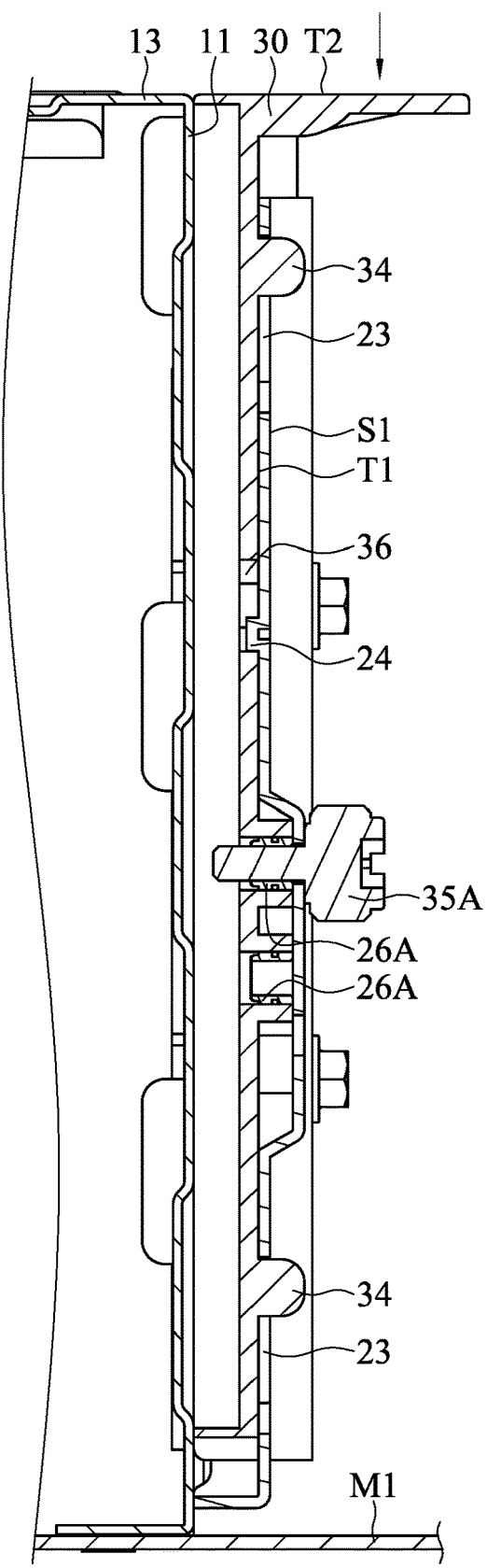
FIG. 12 illustrates another partial cross-sectional view of a chassis when a slidable member is at a second position and a matching portion is a bolt according to some embodiments.
Figure 13:
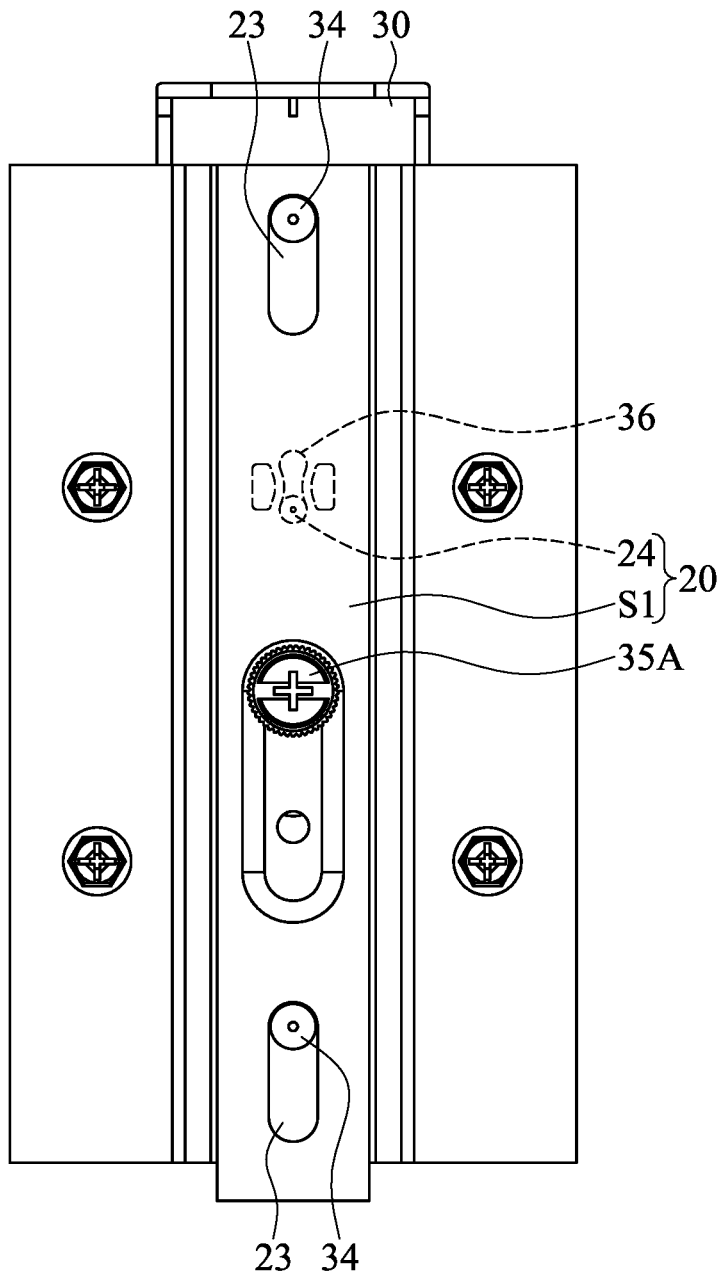
FIG. 13 illustrates a schematic side view of a fixed member and a slidable member when a slidable member is at a second position and a matching portion is a bolt according to some embodiments.

FIG. 12 illustrates another partial cross-sectional view of a chassis when a slidable member is at a second position and a matching portion is a bolt according to some embodiments. FIG. 13 illustrates a schematic side view of a fixed member and a slidable member when a slidable member is at a second position and a matching portion is a bolt according to some embodiments. Carrying on with the above, as shown in FIG. 12 and FIG. 13, the bolt is locked to the locking hole close to the top plate 13. That is to say, the matching portion 35A is locked to the positioning portion 26A close to the top plate 13. In this case, the slidable member 30 is at the second position. Conversely, if the slidable member 30 is required to be switched from the second position to the first position, the matching portion 35A is required to be unlocked from the positioning portion 26A close to the top plate 13, and a force is applied to the handle block T2 of the slidable member 30 to face the housing M1 (the force application direction is a direction toward the bottom of the figure as shown by the arrow in FIG. 12). In this way, the slidable member 30 can be moved toward the first position.

As shown in FIG. 10 to FIG. 13, in some embodiments, the fixed member 20 further includes a first pre-positioning structure 24. The first pre-positioning structure 24 is arranged on the positioning plate S1, and the first pre-positioning structure 24 is a bump. The slidable member 30 further includes a second pre-positioning structure 36. The second pre-positioning structure 36 is arranged on a carrying plate T1 of the slidable member 30 along a direction of the housing M1 toward or away from the top plate 13. The second pre-positioning structure 36 is a guide rail, and rail widths of two ends of the guide rail are greater than a rail width of a middle section of the guide rail. The first pre-positioning structure 24 corresponds to the second pre-positioning structure 36. In some embodiments, the first pre-positioning structure 24 is a guide rail, and the second pre-positioning structure 36 is a bump.

Carrying on with the above, referring to FIG. 10 to FIG. 13, in some embodiments, the second pre-positioning structure 36 is arranged on the carrying plate T1 along the direction of the housing M1 toward or away from the top plate 13, and rail widths of two ends of the second pre-positioning structure 36 are greater than a rail width of a middle section. Therefore, when a user gradually moves the slidable member 30 to the first position or the second position, the user may clearly feel the force applied to the handle block T2 gradually decreasing (that is to say, resistance during movement decreases). In this way, the user is reminded that the slidable member 30 has been moved to the first position or the second position.

Carrying on with the above, as shown in FIG. 11 and FIG. 13, in some embodiments, the first pre-positioning structure 24 of the fixed member 20 is a bump, and the second pre-positioning structure 36 of the slidable member 30 is a guide rail. Therefore, the fixed member 20 is made of a metal material, and the slidable member 30 is made of a plastic material. In this way, rigidity of the bump is greater than rigidity of the guide rail, thereby preventing the first pre-positioning structure 24 from being cut by the second pre-positioning structure 36.

Figure 14:
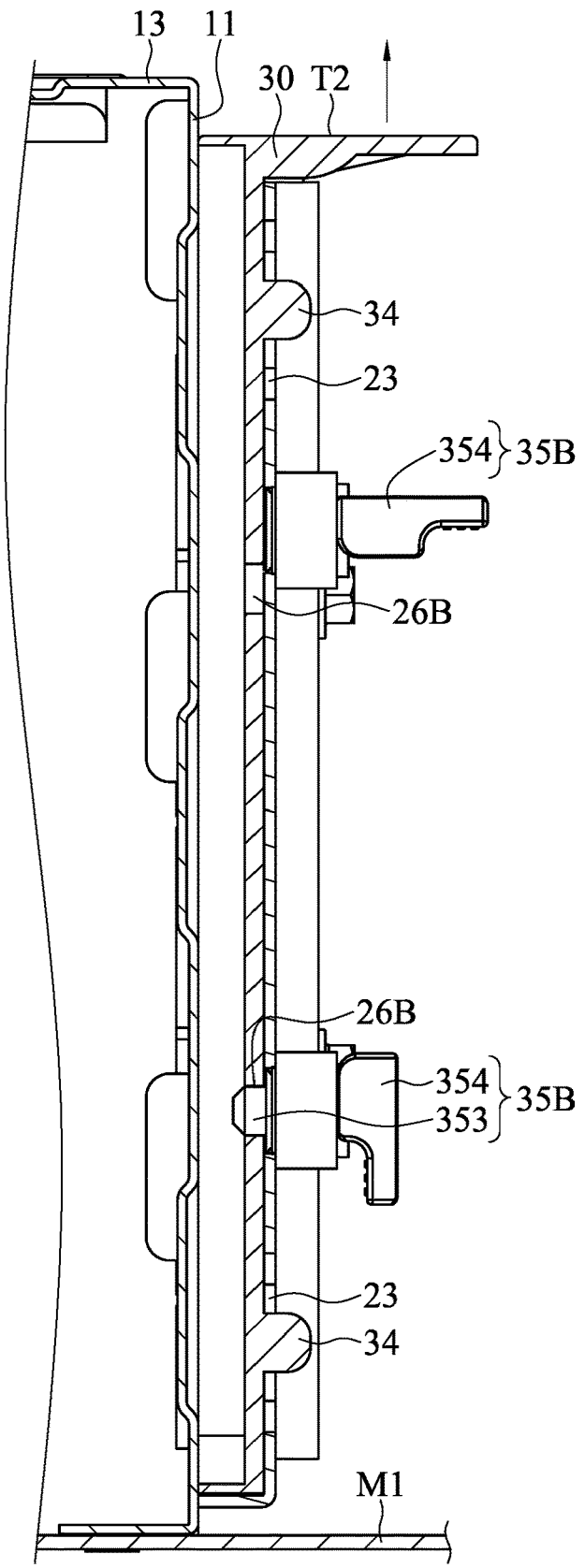
FIG. 14 illustrates another partial cross-sectional view of a chassis when a slidable member is at a first position and a matching portion is a depressable push rod according to some embodiments.

FIG. 14 illustrates another partial cross-sectional view of a chassis when a slidable member is at a first position and a matching portion is a depressable push rod according to some embodiments. Regarding the manner in which the positioning portion matches the matching portion, in another example, as shown in FIG. 14, each positioning portion 26B is a perforation, and the two matching portions 35B are depressable push rods. The depressable push rod includes a protruding rod 353 and a pressing rod 354. When the pressing rod 354 is pressed, the protruding rod 353 moves toward the slidable member 30. When the pressing rod 354 is in a pressed state, the protruding rod 353 is located on the corresponding positioning portion 26B (the perforation).

Figure 15:
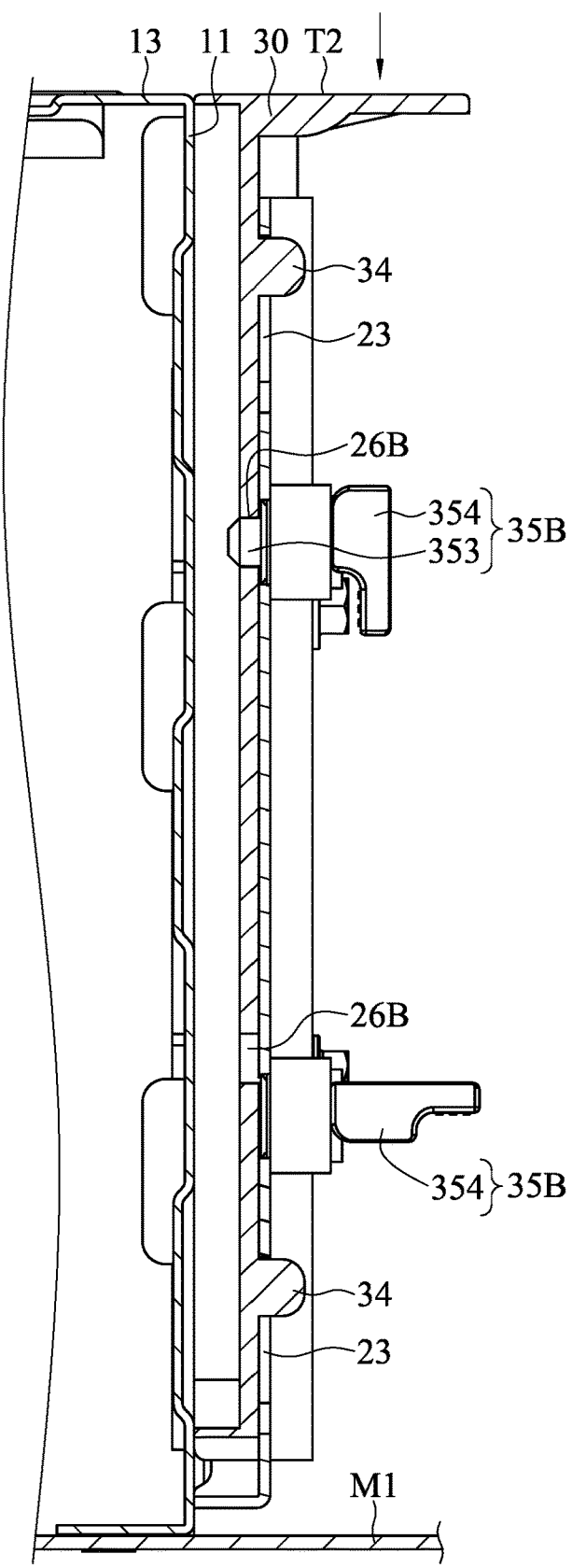
FIG. 15 illustrates another partial cross-sectional view of a chassis when a slidable member is at a second position and a matching portion is a depressable push rod according to some embodiments.

Carrying on with the above, as shown in FIG. 14, when the slidable member 30 is at the first position, the pressing rod 354 of the depressable push rod close to the housing M1 is in a pressed state, and the protruding rod 353 extends through the perforation close to the housing M1. That is to say, the matching portion 35B close to the housing M1 and the positioning portion 26B close to the housing M1 are fixed by means of mating between a shaft and a hole. If the slidable member 30 is required to be switched from the first position to the second position, the pressing rod 354 of the depressable push rod close to the housing M1 is required to be switched to a non-pressed state, and a force is applied to the handle block T2 of the slidable member 30 to move away from the housing M1 (the force application direction is shown by the arrow in FIG. 14). In this way, the slidable member 30 can be moved from the first position to the second position. In an embodiment, as shown in FIG. 14 and FIG. 15, the positioning structure includes two positioning portions 26B, and the matching structure includes two matching portions 35B. The two matching portions 35B are respectively a first matching portion (the depressable push rod at a top of FIG. 14) and a second matching portion (the depressable push rod at a bottom of FIG. 14). Each of the matching portion includes a protruding rod 353 and a pressing rod 354. The slidable member 30 is slidably arranged on the fixed member 20 and includes a first position (the position of the slidable member 30 in FIG. 14) and a second position (a position of the slidable member 30 in FIG. 15). When the slidable member 30 is at the first position (as shown in FIG. 14), the protruding rod 353 of the first matching portion 35B is not located in the positioning portion 26B, and the protruding rod 353 of the second matching portion 35B is located in (extends into) the positioning portion 26B. When the slidable member 30 is at the second position (as shown in FIG. 15), the protruding rod 353 of the first matching portion 35B is located in (extends into) the positioning portion 26B, and the protruding rod 353 of the second matching portion 35B is not located in the positioning portion 26B.

FIG. 15 illustrates another partial cross-sectional view of a chassis when a slidable member is at a second position and a matching portion is a depressable push rod according to some embodiments. Carrying on with the above, as shown in FIG. 14 and FIG. 15, the pressing rod 354 of the depressable push rod close to the top plate 13 is in a pressed state, and the protruding rod 353 extends through the perforation close to the top plate 13. That is to say, the matching portion 35B close to the top plate 13 and the positioning portion 26B close to the top plate 13 are fixed by means of mating between a shaft and a hole. In this case, the slidable member 30 is at the second position. Conversely, if the slidable member 30 is required to be switched from the second position to the first position, the pressing rod 354 of the depressable push rod close to the top plate 13 is required to be switched to a non-pressed state, and a force is applied to the handle block T2 of the slidable member 30 to face the housing M1 (the force application direction is shown by the arrow in FIG. 15). In this way, the slidable member 30 can be moved toward the first position.

Figure 16:
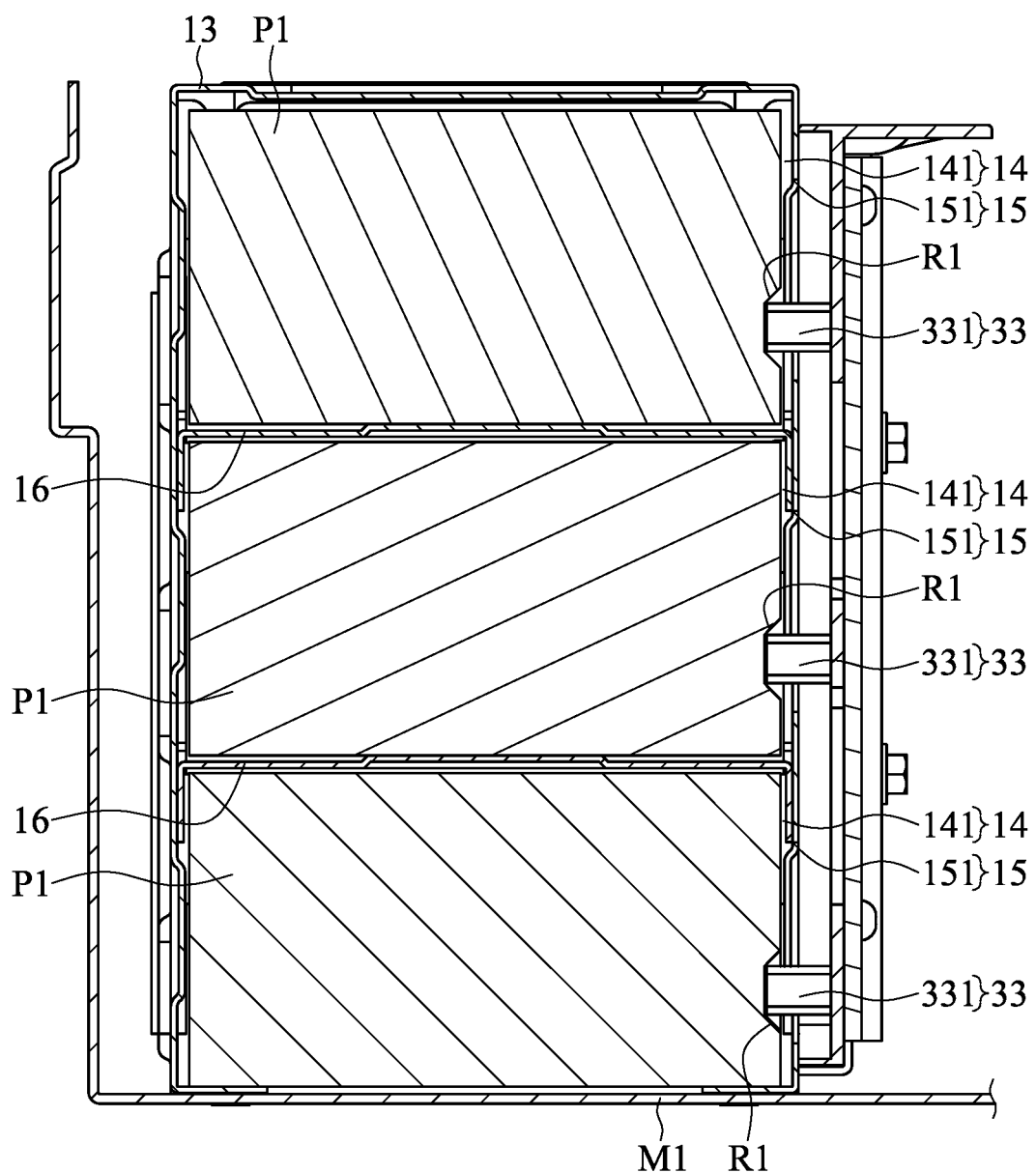
FIG. 16 illustrates a schematic partial cross-sectional view of a chassis when an electronic device includes three accommodating sub-portions and the slidable member is at a first position according to some embodiments.

FIG. 16 illustrates a schematic partial cross-sectional view of a chassis when an electronic device includes three accommodating sub-portions and the slidable member is at a first position according to some embodiments. As shown in FIG. 16, in some embodiments, the box body 10 further includes two separators 16. The two separators 16 are equally arranged side by side between the top plate 13 and the housing M1. In this way, the accommodating portion 14 is equally separated into three accommodating sub-portions 141 by the two separators 16.

Carrying on with the above, as shown in FIG. 16, the corresponding portion 15 on the first side plate 11 further includes three corresponding sub-portions 151. The three corresponding sub-portions 151 are sequentially arranged and respectively in communication with the above three accommodating sub-portions 141. In some embodiments, the corresponding sub-portion 151 is a sub-opening, that is to say, the sub-opening is connected to the accommodating sub-portion 141.

Carrying on with the above, as shown in FIG. 16, the mismatch-proof structure 33 further includes three mismatch-proof portions 331. The three mismatch-proof portions 331 are arranged in sequence. The three mismatch-proof portions 331 are respectively located on the three corresponding sub-portions 151, and respectively extend into the three accommodating sub-portions 141 through the three corresponding sub-portions 151.

Carrying on with the above, as shown in FIG. 16, when the slidable member 30 is at the first position, the accommodating portion 14 is equally separated into three accommodating sub-portions 141 by the two separators 16, the three corresponding sub-portions 151 are respectively in communication with the above three accommodating sub-portions 141, and the three mismatch-proof portions 331 respectively extend into the three accommodating sub-portions 141 through the three corresponding sub-portions 151. Therefore, three power supplies P1 can be respectively accommodated in the three accommodating sub-portions 141, and the three recesses R1 can be respectively mated with the three mismatch-proof portions 331.

Figure 17:
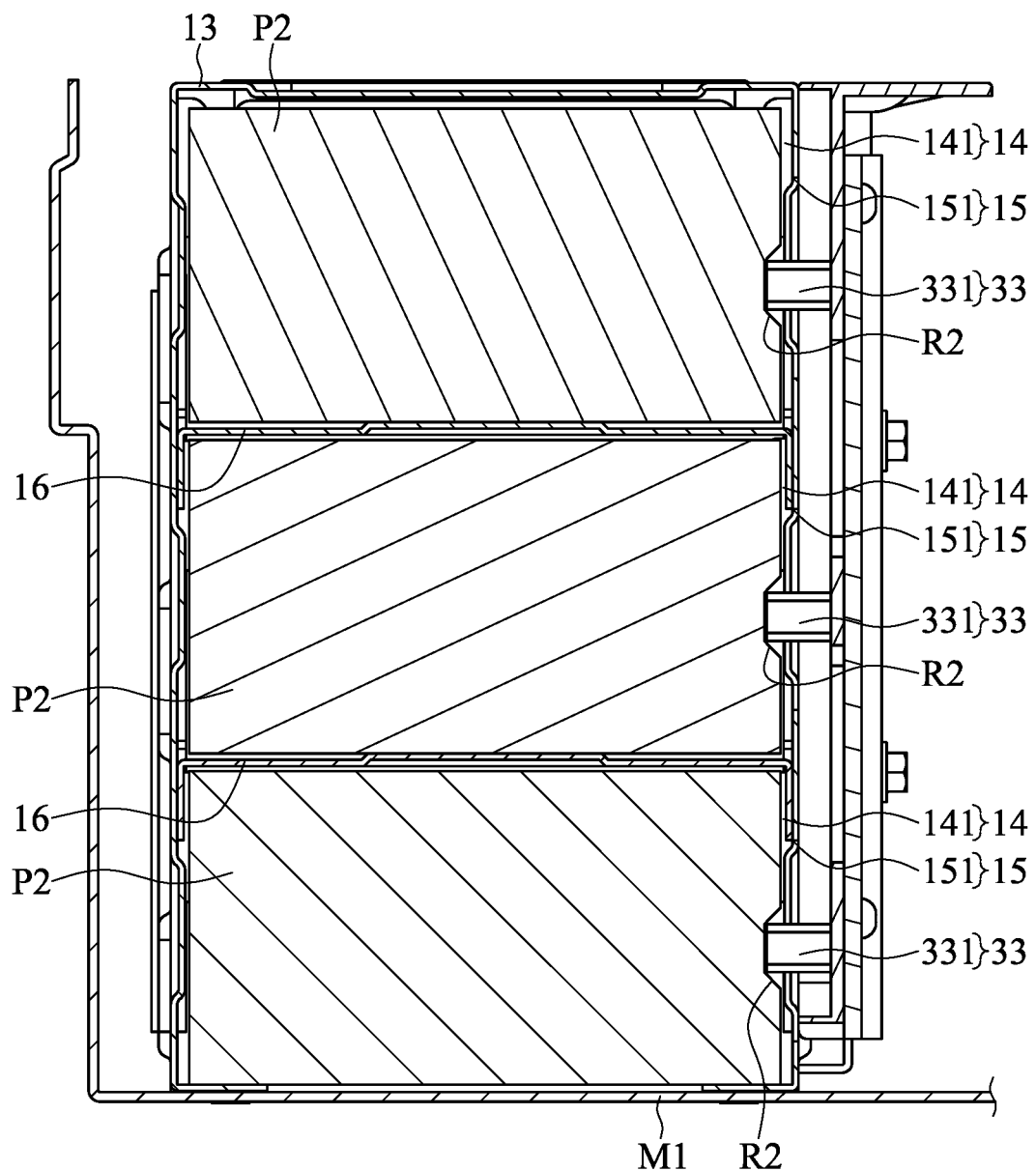
FIG. 17 illustrates a schematic partial cross-sectional view of a chassis when an electronic device includes three accommodating sub-portions and the slidable member is at a second position according to some embodiments.

FIG. 17 illustrates a schematic partial cross-sectional view of a chassis when an electronic device includes three accommodating sub-portions and the slidable member is at a second position according to some embodiments. As shown in FIG. 17, when the slidable member 30 is at the second position, the accommodating portion 14 is equally separated into three accommodating sub-portions 141 by the two separators 16, the three corresponding sub-portions 151 are sequentially arranged and respectively in communication with the above three accommodating sub-portions 141, and the three mismatch-proof portions 331 respectively extend into the three accommodating sub-portions 141 through the three corresponding sub-portions 151. Therefore, three power supplies P2 can be respectively accommodated in the three accommodating sub-portions 141, and the three recesses R2 can be respectively mated with the three mismatch-proof portions 331.

Based on the above, according to some embodiments, in the electronic device, the slidable member is located in the sliding groove of the fixed member, a plurality of mismatch-proof portions of the mismatch-proof structure in the slidable member are respectively located in the plurality of corresponding sub-portions in communication with the plurality of accommodating sub-portions, and the matching structure of the slidable member matches the positioning structure of the fixed member. In this way, the plurality of mismatch-proof portion can move in the plurality of sub-corresponding portions respectively as the slidable member moves in the sliding groove. The matching structure matches the positioning structure, to cause the plurality of mismatch-proof portions in communication with the plurality of accommodating sub-portions to be locked at different positions in the accommodating portion. In some embodiments, the electronic device may adjust the position of the mismatch-proof structure for a plurality of power supplies having applicable specifications, to support the diversity of the electronic product in design. In addition, in some embodiments, the power supply having an inapplicable specification may also be prevented from existing among the plurality of power supplies accommodated in the plurality of accommodating sub-portions.

What is claimed is:

1. An electronic device, comprising:
   a box body, comprising a first side plate having a corresponding portion;
   a fixed member, fixed to the first side plate and comprising a positioning structure; and
   a slidable member, slidably arranged on the fixed member and comprising a matching structure and a mismatch-proof structure, wherein the mismatch-proof structure is arranged in the corresponding portion, and the matching structure is selectively fixed in the positioning structure to cause the mismatch-proof structure to be slidably arranged in the corresponding portion.

2. The electronic device according to claim 1, wherein the positioning structure comprises a plurality of positioning portions, the matching structure comprises a matching portion, and the matching portion selectively matches one of the positioning portions.

3. The electronic device according to claim 1, wherein the positioning structure comprises a positioning portion, the matching structure comprises a plurality of matching portions, and one of the matching portions selectively matches the positioning portion.

4. The electronic device according to claim 3, wherein each of the matching portion comprises an inclined surface and an abutment surface, and the inclined surface is connected to the abutment surface.

5. The electronic device according to claim 4, wherein the fixed member further comprises a first guiding portion, the slidable member further comprises a second guiding portion, and the first guiding portion corresponds to the second guiding portion.

6. The electronic device according to claim 1, wherein the positioning structure comprises two positioning portions, the matching structure comprises two matching portions, the two matching portions are a first elastic arm and a second elastic arm, and the first elastic arm is located above the second elastic arm, the first elastic arm and the second elastic arm comprise a fixed end and a movable end respectively, and the movable end comprises an inclined surface and an abutment surface; the slidable member is slidably arranged on the fixed member and comprises a first position and a second position; when the slidable member is at the first position, the inclined surface of the first elastic arm abuts against the fixed member and does not protrude from the corresponding positioning portion, and the abutment surface of the second elastic arm abuts against the corresponding positioning portion and protrudes from the corresponding positioning portion; when the slidable member is at the second position, the abutment surface of the first elastic arm abuts against the corresponding positioning portion and protrudes from the corresponding positioning portion, and the inclined surface of the second elastic arm abuts against the fixed member and does not protrude from the corresponding positioning portion.

7. The electronic device according to claim 1, wherein the fixed member comprises a sliding groove, and the slidable member is slidably arranged in the sliding groove.

8. The electronic device according to claim 7, wherein the sliding groove comprises a bottom, and the bottom faces the first side plate.

9. The electronic device according to claim 1, wherein the fixed member further comprises a first pre-positioning structure, the slidable member further comprises a second pre-positioning structure, and the first pre-positioning structure corresponds to the second pre-positioning structure.

10. The electronic device according to claim 9, wherein the first pre-positioning structure is a bump, and the second pre-positioning structure is a guide rail.

11. The electronic device according to claim 10, wherein the box body comprises a top plate connected to the first side plate, the guide rail is arranged on the slidable member in a direction toward or away from the top plate, rail widths of two ends of the guide rail are greater than a rail width of a middle section of the guide rail.

12. The electronic device according to claim 1, wherein the box body comprises an accommodating portion and a plurality of separators, the accommodating portion is separated into a plurality of accommodating sub-portions by the separators, the corresponding portion comprises a plurality of corresponding sub-portions, the mismatch-proof structure comprises a plurality of mismatch-proof portions, the corresponding sub-portions are respectively in communication with the accommodating sub-portions, and the mismatch-proof portions are respectively located on the corresponding sub-portions.

13. The electronic device according to claim 1, wherein the positioning structure comprises two positioning portions, the matching structure comprises two matching portions, the two matching portions are a first matching portion and a second matching portion, and the first matching portion and the second matching portion comprise a protruding rod respectively; the slidable member is slidably arranged on the fixed member and comprises a first position and a second position; when the slidable member is at the first position, the protruding rod of the second matching portion is located in one of the two positioning portions; and when the slidable member is at the second position, the protruding rod of the first matching portion is located in another one of the two positioning portions.

14. A chassis, comprising:
a housing; and
an electronic device, fixed to the housing and comprising:
a box body, comprising a first side plate, wherein the first side plate comprises a corresponding portion;
a fixed member, fixed to the first side plate and comprising a positioning structure; and
a slidable member, slidably arranged on the fixed member and comprising a matching structure and a mismatch-proof structure, wherein the mismatch-proof structure is arranged in the corresponding portion, and the matching structure is selectively fixed in the positioning structure to cause the mismatch-proof structure to be slidably arranged in the corresponding portion.

15. The chassis according to claim 14, wherein the positioning structure comprises a plurality of positioning portions, the matching structure comprises a matching portion, and the matching portion selectively matches one of the positioning portions.

16. The chassis according to claim 15, wherein the matching portion comprises an inclined surface and an abutment surface, and the inclined surface is connected to the abutment surface.

17. The chassis according to claim 14, wherein the fixed member further comprises a first guiding portion, the slidable member further comprises a second guiding portion, and the first guiding portion corresponds to the second guiding portion.

18. The chassis according to claim 14, wherein the fixed member comprises a sliding groove, the slidable member is slidably arranged in the sliding groove, the sliding groove comprises a bottom, and the bottom faces the first side plate.

19. The chassis according to claim 14, wherein the fixed member further comprises a first pre-positioning structure, the slidable member further comprises a second pre-positioning structure, and the first pre-positioning structure corresponds to the second pre-positioning structure.

20. The chassis according to claim 14, wherein the box body comprises an accommodating portion and a plurality of separators, the corresponding portion comprises a plurality of corresponding sub-portions, the mismatch-proof structure comprises a plurality of mismatch-proof portions, the accommodating portion is separated into a plurality of accommodating sub-portions by the separators, the corresponding sub-portions are respectively in communication with the accommodating sub-portions, and the mismatch-proof portions are respectively located on the corresponding sub-portions.

* * * * *